United States Patent [19]

Schrage

[11] Patent Number: 5,349,821
[45] Date of Patent: Sep. 27, 1994

[54] AUGMENTED THERMAL BUS WIH MULTIPLE THERMOELECTRIC DEVICES INDIVIDUALLY CONTROLLED

[75] Inventor: Dean S. Schrage, Strongsville, Ohio

[73] Assignee: The United States of America as represented by the Administrator of the National Aeronautics and Space Administration, Washington, D.C.

[21] Appl. No.: 81,891

[22] Filed: Jun. 25, 1993

[51] Int. Cl.⁵ .............................. F25B 21/02
[52] U.S. Cl. ......................... 62/3.7; 62/3.2
[58] Field of Search ..................... 62/3.2, 3.7

[56] References Cited

U.S. PATENT DOCUMENTS

| | | |
|---|---|---|
| 2,844,638 | 7/1958 | Lindenblad .............................. 136/4 |
| 2,903,857 | 9/1959 | Lindenblad .............................. 62/3 |
| 3,304,726 | 2/1967 | Beck ....................................... 62/3.7 |
| 3,438,214 | 4/1969 | Schmittle .................................. 62/3 |
| 3,481,393 | 12/1969 | Chu ....................................... 165/80 |
| 4,310,047 | 1/1982 | Branson .................................. 164/64 |
| 4,610,142 | 9/1986 | Davis ....................................... 136/4 |
| 4,848,090 | 7/1989 | Peters ....................................... 62/33 |
| 5,022,928 | 6/1991 | Buist ....................................... 136/212 |
| 5,269,146 | 12/1993 | Kerner ..................................... 62/3.7 |

*Primary Examiner*—John M. Sollecito
*Attorney, Agent, or Firm*—Gene E. Shook; Guy M. Miller

[57] ABSTRACT

The present invention is directed to an augmented thermal bus. In the present design a plurality of thermoelectric heat pumps are used to couple a source plate to a sink plate. Each heat pump is individually controlled by a model based controller. The controller coordinates the heat pumps to maintain isothermality in the source.

5 Claims, 6 Drawing Sheets

AUGMENTED THERMAL BUS WIH MULTIPLE THERMOELECTRIC DEVICES INDIVIDUALLY CONTROLLED

ORIGIN OF INVENTION

The invention described herein was made in the performance of work under a NASA contract and is subject to the provisions of Section 305 of the National Aeronautics & Space Act 1958, as amended, (42 U.S.C 2457).

FIELD OF INVENTION

The present invention is directed to a thermal bus for dissipating heat by using a plurality of individually controlled thermo-electric heat pumps(TEHP). Each heat pump individually controls a region on a source. The orchestrated control of all the TEHP unit, is performed by a model based controller.

In thermal bus arrangements found in the prior art, a baseplate housing electronics is coupled to a coldplate through a thermo-electric heat pump. Integral with the coldplate is a fluid loop attached to radiator panels which discharges the energy convected at the coldplate. The working fluid in the coldplate acts as a shunt to couple the electronics to remotely located radiator panels. Each component has an associated thermal resistance which, as a function of design, is a measure of the temperature drop across that component for a given heat load. Waste heat is dissipated in these systems through conduction. The waste heat in prior art systems is not upgraded to a higher temperature, therefore these systems require large radiator panels to reject the heat.

While the prior art design of a thermal bus is simple and reliable, the overall effectiveness of the device is diminished by the radiator and liquid inventory weight restrictions, in conjunction with limited coldplate isothermality.

When feedback control has been applied in the prior art thermal bus units, it has taken the form of PID controllers. Although the PID controller takes temperature variation (set point temperature minus the actual) into account, in an attempt to maintain isothermality, it is a limited control mechanism.

Traditionally, these PID controllers have been used in the prior art, to offer a single point of control. The concept can be extended to several PID loops, thereby controlling several set points in the plane of a source. However, the extension of PID controllers in this fashion, does not compensate for conduction heating, in the plane of the source. The individual heat control actions between PID units would not be coordinated. Therefore, in performing heat control, thermal bus designs in the prior art do not take the heating or cooling that is provided by the other TEHP units, into account. As a result, these systems could only offer coupled heat control.

It is, therefore, an object of the present invention to create a thermal bus with a higher level of isothermality in a heat source or baseplate.

It is a further objective of the present invention to upgrade the waste heat produced by the system thereby reducing the surface area required for a radiator.

It is still a further object of the present invention to individually control areas of a heat source relative to a sink by using a plurality of thermo-electric heat pumps.

It is still yet a further object of the present invention to achieve decoupled temperature control of a thermal bus by using a model based feedback control system.

DESCRIPTION OF THE RELATED ART

U.S. Pat. No. 4,848,090 by Peters discloses an apparatus and a method for controlling the temperature of a semiconductor device.

U.S. Pat. No. 3,481,393 by Chu discloses a cooling system for modular packaged electronic components.

U.S. Pat. No. 3,438,214 by Schmittle discloses a thermoelectric temperature control system for cooling and heating of a substance flowing therethrough.

U.S. Pat. No. 4,610,142 by Davis discloses an apparatus and method for controlling the temperature of a reagent refrigerator.

U.S. Pat. Nos. 2,844,638 and 2,203,857 by Lundenblad, both disclose a thermoelectric heat pump which is made of a compact thin panel construction.

U.S. Pat. No. 4,310,047 by Branson discloses a device for maintaining an objective at a given temperature by means of a thermoelectric heat pump held between a thermally conductive member and a heat sink.

U.S. Pat. No. 5,022,928 to Burst discloses a TEHP comprising p-type and n-type semiconductor film conductive elements selectively patterned on substrates.

SUMMARY OF THE INVENTION

The present invention is an augmentation of a conventional single-phase thermal bus with an interstitial thermo-electric heat pump(TEHP). The thermo-electric heat pump is a solid-state direct energy conversion device. Since the TEHP does not have any moving parts it is structurally and thermally robust making it uniquely suited for temperature cooling in a hostile environment.

In the present invention, a modular thermal bus includes target electronics which are mounted on a baseplate forming a source. A plurality of TEHP devices are compression mounted between the source and a sink. The sink has a fluid loop which is coupled to radiator panels. Heat is transported from the source, through the heat pumps to the sink where the fluid loop coupled between the sink and the radiator panels uses the radiator panels to dissipate the heat.

DETAILED DESCRIPTION OF THE PREFERRED EMBODIMENT

Figure 1:
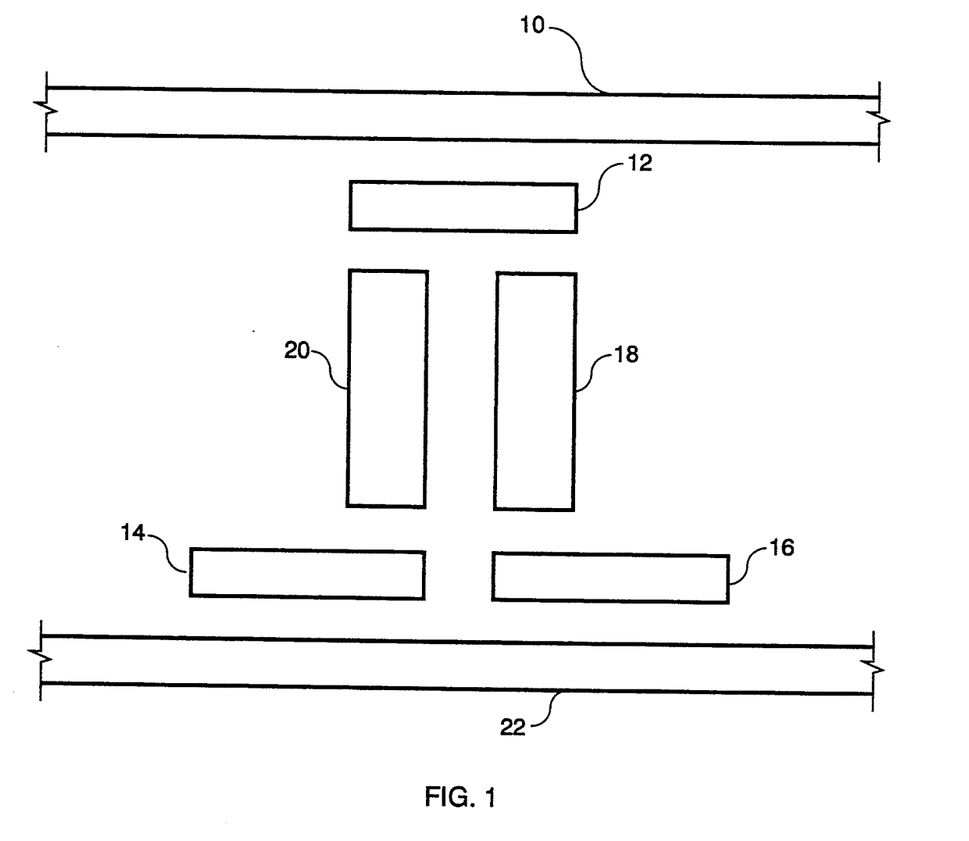
FIG. 1 displays a schematic of a thermo-electric heat pump.

FIG. 1 displays the thermo-electric heat pump module. A hot junction 10 and a cold junction 22 sandwich the terminal leads 12, 14, 16, a p-type junction 18 and a n-type junction 20. The hot junction 10 is connected to a baseplate or source, and the cold junction 22 is attached to a coldplate or sink. When power is applied between the terminal leads 12, 14 and 16, heat will flow across an adverse temperature gradient from the hot junction 10 to the cold junction 22 thereby dissipating the heat developed by the electronic components.

Figure 2:
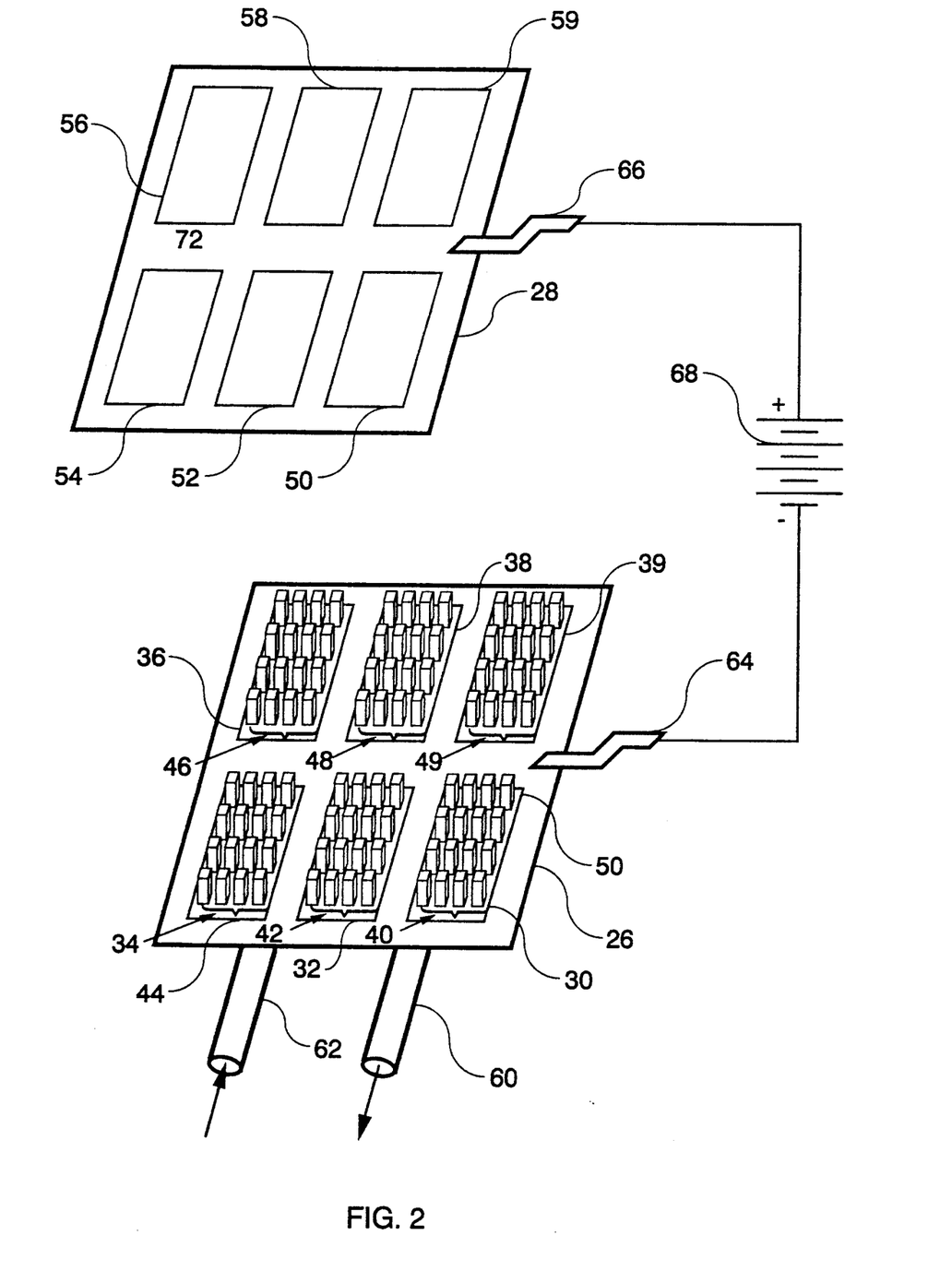
FIG. 2 displays a schematic of a TEHP-assisted thermal bus.

FIG. 2 displays a schematic view of the TEHP-assisted thermal bus. A coldplate or sink 26 is coupled to a fluid loop formed by 60 and 62 which enables fluid to circulate through the coldplate, thereby dissipating heat. A plurality of quadrants 30, 32, 34, 36, 38 and 39 house a plurality of thermo-electric heat pumps denoted by 40, 42, 44, 46, 48, and 49, respectively. A negative polarity busbar 64 is also attached to the coldplate 26, thereby enabling a negative voltage across the coldplate 26.

The thermo-electric heat pumps 40, 42, 44, 46, 48, and 49 are sandwiched between the coldplate 26 and the baseplate or source 28, thereby offering a conductive heat pathway. Electronics are located in the matching quadrants 50, 52, 54, 56, 58 and 59 of the baseplate 28, thereby enabling each quadrant to be controlled by a TEHP unit denoted by 40, 42, 44, 46, 48 and 49, respectively.

A busbar for carrying a positive current 66 is also attached to the baseplate 28. The busbar for positive current 66 and the busbar for negative current 64 are connected through a power supply 68. By placing a positive polarity across the source or baseplate 28 and a negative polarity across the sink or coldplate 26, voltage is applied across the TEHP devices 40, 42, 44, 46, 48 and 49. The applied voltage would cause heat to flow from the source or baseplate 28 to the sink or coldplate 26 across an adverse temperature gradient.

Figure 3:
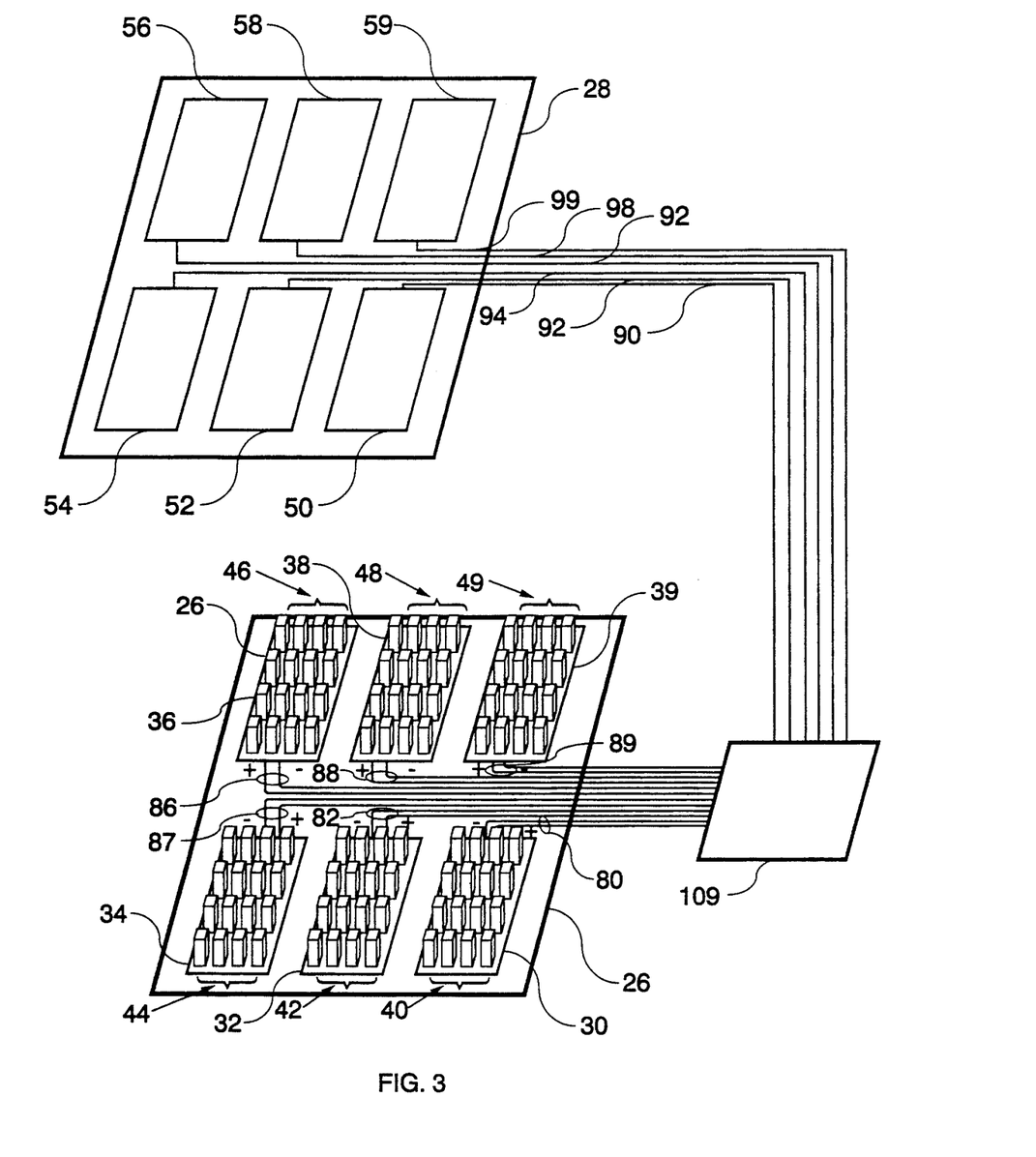
FIG. 3 displays the connection between the cold plate of the TEHP-assisted thermal bus and a feedback controller.

FIG. 3 displays a schematic view of the coldplate 26 with quadrants 30, 32, 34, 36, 38, and 39 each controlled by a controller 109, through connections 80, 82, 84, 86, 88, and 89 respectively.

Figure 4:
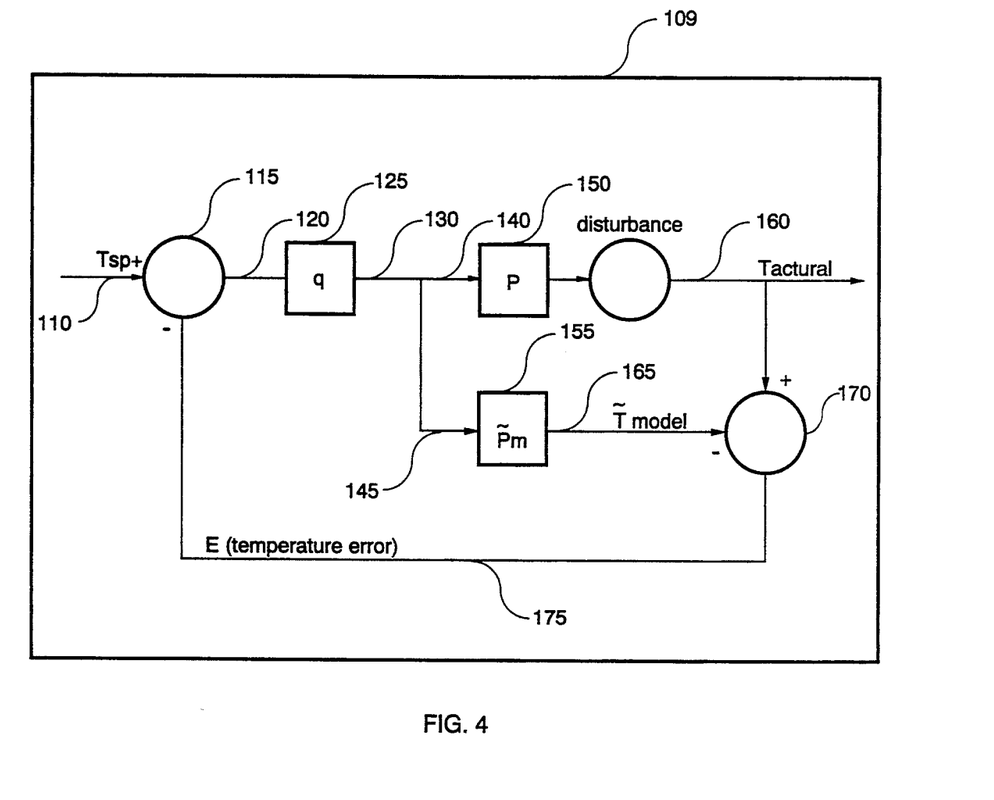
FIG. 4 displays a conceptual graph of the TEHP-assisted thermal bus without TEHP assistance.

FIG. 4 displays a schematic flow diagram of the methodology used in the controller 109 presented in FIG. 3. The controller 109 receives an output of temperature readings generated by thermocouple or thermistors located in the quadrants 50, 52, 54, 56, 58 and 59 of the baseplate, 28 shown in FIG. 3. The temperature readings are transported through the hard-wired connections 90, 92, 94, 96, 98 and 99, depicted in FIG. 3. The temperature readings are inputed into the controller 109 shown in FIG. 4, at location 160, as an array of process temperatures.

According to the present invention, temperature, voltage and current measurements are taken of each quadrant of the source. These parameters along with several other parameters define the process of the augmented thermal electric heat pump, which is denoted by 150.

A mathematically based model of the augmented thermal bus is also maintained by the controller 109. The modelled process is denoted by 155. Both the actual process 150 and the modelled process 155 produce arrays of temperature outputs at 160 and 165, respectively. The process temperature array at 160 and the modelled temperature array at 165, are summed at 170. When there is a difference between the process temperature array 160 and the modelled temperature array at 165, an error array occurs at 175. This error array represents a deviation from the expected operation of the system as described by 155. The error in temperature 175 is then summed with a set point temperature array at 115. The set point temperature array is an array of temperature values set for quadrants 50, 52, 54, 56, 58 and 59. The expected inverse model array 120 represents a deviation from the set point temperature of the baseplate. The expected inverse model array 120 serves as the input for the inverse of the modelled process 125. The inverse of the modelled process augmented with a conditioning filter, 125 produces an output 130 that tries to correct for the expected inverse model array 120. The output from the inverse of the modelled process 130, is an array of voltages or currents used to control the TEHP devices, thereby compensating for the expected inverse model array, denoted by 120. The voltage change at 130 will serve as an input to both the actual process at 140 and the modelled process at 145. Changing the voltage or current inputs 140 and 145 will result in an increase of the pumping capacity of the TEHP units, to accommodate for the change in isothermality.

In the case where there is no disturbance in the operation of the augmented thermal bus, the process temperature array at 160 would equal the model temperature array at 165. When these two values are summed there would not be any error at 170 therefore, there would be no error temperature at 175. Also, the value fed into the inverse model 125 would be equal to the value of the set point temperature array 110. Since the set point temperature array at 110 are the values that the inverse model 125 expects as input, there is no variation in the output voltage at 130. Consequently, there would not be any change in the inputs to the process at 140 or the modelled process at 145. In the scenario given above, the the pumping capacity of the individual TEHP units would not be altered.

As an example of a case where a disturbance does occur, in FIG. 3, a first quadrant 50, a second quadrant 52 and a third quadrant 54 are controlled by a first TEHP unit 40, a second TEHP unit 42 and a third TEHP unit 44. If the second TEHP unit 42 were to fail, it would cause quadrant 52 to increase in temperature. Due to conduction heating in the plane of the source, quadrants 50 and 54 would also increase in temperature. The thermocouple senses this activity and reports a T1 representing the first temperature, a T2 representing a second temperature and a T3 representing a third temperature back to the controller through the hard wired connection 90, 92 and 94, respectively. These three values, T1 the temperature of quadrant 50, T2 the temperature of quadrant 52 and T3 the temperature of quadrant 54 would be fed back into our model at 160. When the process temperature array [T1, T2, T3] at 160 are combined with the model 160 temperature array [T1m, T2m, T3m] at location 170, the first temperature of the process (T1) will cancel the first temperature of the model (T1m). The third temperature of the process (T3) will cancel the third temperature of the modelled process (T3m). However, the second temperature of the model (T2), will not cancel the second temperature of the model (T2m). Therefore there will be a non-zero value T2e at 175, which represents an error in the augmented thermal bus. The error temperature array [0, T2e, 0] will be combined at 115 with the set point temperature array [T1sp, T2sp, T3sp]. As a result of the combination at 115, the inverse model 125 will note a deviation in the set point temperature for the second quadrant, since T2e will be subtracted from T2sp. Since the inverse model 125 will receive a set point temperature that is lower than what it expects (T2sp-T2e) for the second quadrant, the inverse model 125 would vary the voltage outputs to the TEHP units surrounding that quadrant would require a contingency instruction; after knowing that TEHP/q2 failed the controller would define new objectives such as to control the average temperature of all quadrants in the vicinity of the failed quadrant to the average set point.

In our example, these two quadrants are physically represented by unit 40 and 44 of FIG. 4. By increasing the pumping capacity of units 40 and 44, voltage variations would be fed back into the process 150, through input 140 and to the modelled process 155, through input 145. Assuming that the actual process 150 was just combined with the set point temperature back into the inverse process 125, we would experience coupled temperature control. However, by combining the modelled temperature 165 with the actual temperature 160 and then feeding the temperature error 175 back into the inverse of the model 125, decoupled cooling is achieved in the augmented thermal bus system.

A mathematical description would include the following:

T1—temperature in the first quadrant
T2—temperature in the second quadrant
T3—temperature in the third quadrant
q1—the inverse model of the first region
q2—the inverse model of the second region
q3—the inverse model of the third region
x—a scaler multiple
y—a scaler multiple In the coupled case, the process temperature array is multiplied by the matrix of the process 150 to produce the following output:

$$\begin{bmatrix} T1 \\ T2 \\ T3 \end{bmatrix} \begin{bmatrix} q1 & 0 & 0 \\ 0 & q2 & 0 \\ 0 & 0 & q3 \end{bmatrix} = \begin{bmatrix} T1q1 \\ T2q2 \\ T3q3 \end{bmatrix}$$

In this coupled representation, the inverse process will respond to T1, T2 and T3 individually through q1, q2, and q3 without ever accounting for the temperature changes or disturbances occurring in other regions. However, by adding the inverse model 125 and developing q as the inverse of the modelled process 155, the following conceptual formulation would result:

$$\begin{matrix} 1 \ldots \\ 2 \ldots \\ 3 \ldots \end{matrix} \begin{bmatrix} T1 \\ T2 \\ T3 \end{bmatrix} \begin{bmatrix} q_{11} & xq_{12} & yq_{13} \\ q_{21} & q_{22} & q_{23} \\ q_{31} & q_{32} & q_{33} \end{bmatrix} =$$

$$\begin{bmatrix} T1q_{11} + xT2q_{12} + yT3q_{13} \\ T1q_{21} + T2q_{22} + T3q_{23} \\ T1q_{31} + T2q_{32} + T3q_{33} \end{bmatrix}$$

Where q12 and q13 are some multiple of q22 and q33, respectively.

The result is a decoupled cooling process. The temperature in quadrant 1 (T1), the temperature in quadrant (T2) and the temperature in quadrant three (T3) will be adjusted taking the other temperature regions into account, as displayed by the resulting decoupled vector, in equation 1 (T1q$_{11}$+xT2q$_{12}$+yT3q$_{13}$).

Figure 5:
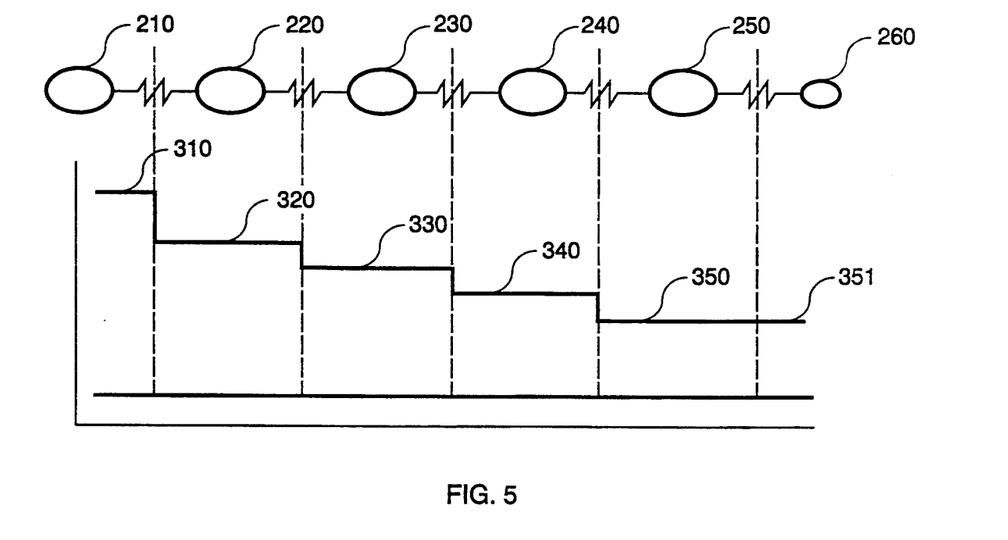
FIG. 5 displays a conceptual graph of the TEHP-assisted thermal bus with TEHP assistance.

FIG. 5. displays a conceptual view of the temperature flow in a conventional thermal bus. The electronics mounted on the baseplate, denoted by 210 functions as a source, generating heat at a temperature 310. The baseplate denoted by 220 receives this heat at a slightly lower temperature 320. In the conventional thermal bus the baseplate denoted by 220 would be directly coupled to the coldplate denoted by 230. The coldplate would experience another loss in temperature 330, as a result of the conduction process. The loss in temperature would continue through the fluid loop 240 coupled to the coldplate, the radiator denoted by 250 and culminating in the effective sink denoted by 260. In each of these steps, the heat flow due to conduction has an associated temperature drop 340, 350, and 351, respectively.

Figure 6:
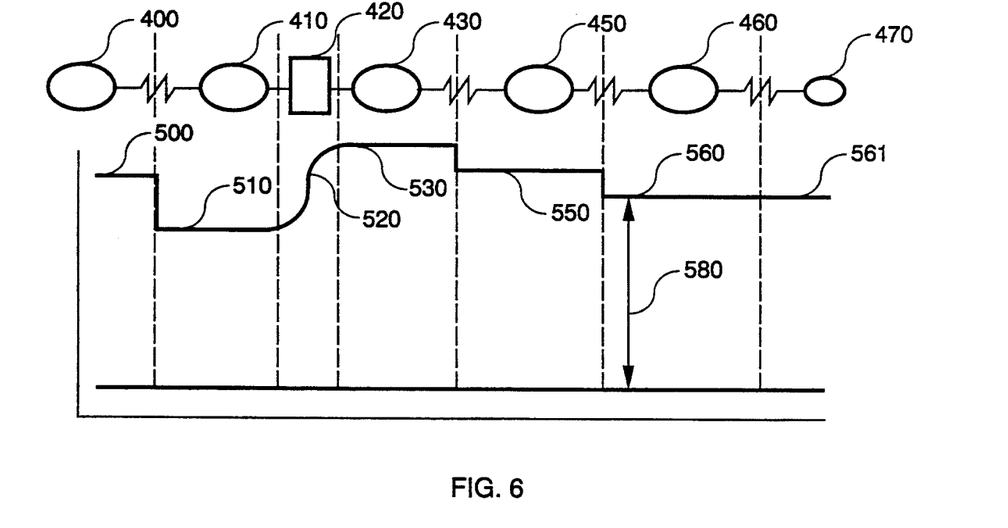
FIG. 6 is a block diagram of the feedback control method performed in accordance with the present invention.

FIG. 6 displays the thermal bus with the thermo-electric heat pumps, located between the baseplate and the coldplate. The electronics 400 and the baseplate 410 receive the convectional temperature drop, as denoted by 500 and 510. However, in the TEHP assisted thermal bus, a TEHP denoted by 420 is placed between the baseplate 410 and the coldplate 430. Therefore instead of experiencing a temperature drop between the baseplate 410 and the coldplate 430, heat is pumped across an adverse temperature gradient from the baseplate 410 to the coldplate 430. The result is the increase in temperature from the temperature in the baseplate 510, across an adverse temperature gradient 520, to the temperature of the coldplate 530. The fluid loop coupled to the baseplate denoted by 450 and the radiator 460, continue to decrease the temperature from 550 to 560. The radiator 460 maintains the same temperature of the effective heat sink 470. The radiator temperature 560 is normally the same as the effective sink temperature 561.

The effective heat transfer coefficient is equal to the third power of the power of the radiator temperature (h~T$^3$). As a result, radiating at a higher radiator temperature requires a radiator with a smaller surface area. Therefore, the overall result of adding the TEHP to upgrade the waste heat at 520, is a smaller radiator at 580.

Each TEHP unit will individually control an area on the source. When a small direct current is applied to the TEHP devices, thermal energy is pumped from the source or baseplate to the thermal sink or coldplate, across an adverse temperature gradient. As a result, a TEHP unit will be responsible for transferring heat from an individual quadrant on the source, to the sink. Each of the TEHP units within a quadrant will be individually controlled thereby enabling a controller to vary pumping operation of TEHP units either within the quadrant or surrounding the quadrant. As a result isothermality will be maintained as the fluid loop integral with the coldplate, shifts to an increased sink temperature.

The operation of each of the TEHP units located within the predefined quadrants will be controlled by a model-based feedback controller. The control system maintains isothermality by adjusting the TEHP heat pumping capacity to compensate for scheduled and unscheduled disturbances in the thermal bus. The heat pumping capacity is adjusted while maintaining the local quadrant set-point temperature.

In general, any off-design or contingency operating conditions are considered unscheduled disturbance. Usually these unscheduled disturbances are caused by parasitic heating in the target electronics or variations in the fluid loop inlet temperature. In general, any disturbances or variations in heat or power, may be considered a scheduled disturbance. For example, heating caused by the predictable degradations in the electronic components.

The model-based control system used to control the TEHP units operate by first sensing a process temperature in each quadrant on the source or baseplate. This process temperature array is combined with a modelled temperature array to create a temperature error array. The system then combines the temperature error array with the set point temperature array to produce the expected inverse modelled array, which is an array of set point temperature values, fed into an inverse model of the process. Any variation in the input of the inverse model, causes the model to produce a change in the voltage or current output produced by the inverse model. The result of a change of voltage or current is an increase the pumping capacity of the TEHP units, located in the region of the affected quadrant.

In the case where the set point temperatures are all equal, individually varying the TEHP units will produce a uniform isothermal baseplate. In the event that one of the TEHP units completely fails, the control system will perform load levelling to minimize variations in isothermality. As a result of using model based feedback control, the TEHP unit transfers heat from a quadrant, taking into account the other individually controlled quadrants, thereby maintaining isothermality in the source. Therefore, convection heating in the plane of the source plate, is controlled with a decoupled control method.

For the TEHP units to transfer heat across an adverse temperature gradient the TEHP requires a direct current with less than five percent ripple. A current generator is used in the system to modulate the voltage and current. The nominal voltage and current requirements per device are on the order of 0–0.5 volts and 10 amperes, respectively. The busbar requirements depend on the degree of control required. For applications where the individual TEHP units are controlled with a single power source, the baseplate and coldplate would serve as the busbar. While this design is very simple, redundancy and isothermality control are compromised. If groupings of devices or quadrants are powered separately, each quadrant would require a segregated busbar arrangement. Independent of the number of controlled devices, a single power source is multiplexed with peer transistors operating under the command of the model-based feedback control system. On command, the power is distributed to a specified quadrant of devices, at a specified level, for a specified time, after which the power is switched off and diverted to the next quadrant of devices. The frequency of modulation is dependent on the allowed switching losses and the thermal capacitance of the TEHP and adjoining structure, along with the nature of the thermal disturbance. Low weight structures have low thermal capacitance which would require an increased switching rate, which is desirable. However, an increased switching rate results in parasitic switch heating, which is an undesirable feature.

While the preferred embodiment of the invention is disclosed and described it will be apparent that various modifications may be made without departing from the spirit of the invention or the scope of the subjoined claims.

I claim:

1. A thermal bus comprising:
   a heat source,
   a plurality of quadrants located in said heat source, said quadrants each including a heat sensing means for sensing heat in said heat source,
   a heat sink including a plurality of quadrants each, coupled to one of said plurality of quadrants in said heat source,
   a plurality of thermo-electric heat pumps each positioned between one of said plurality of quadrants located in the heat source and said coupled quadrant in said heat sink, thereby pumping heat from each of said plurality of quadrants in said heat source, to each of said coupled quadrants in said heat sink, and
   a model based controller individually connected between each of said heat sensing means and each of said plurality of thermo-electric heat pumps thereby controlling said plurality of thermo-electric heat pumps by sensing said heat.

2. A thermal bus as claimed in claim 1 wherein said heat sensing means is a thermistor or a thermocouple.

3. An augmented thermal bus comprising:
   a baseplate including a plurality of quadrants for housing electronic components therein,
   a coldplate with a single phase fluid loop coupled thereto, thereby providing a heat sink for said augmented thermal bus,
   a plurality of thermo-electric heat pumps coupling said baseplate to said coldplate,
   a power supply attached between said baseplate and said coldplate thereby creating a voltage potential across said plurality of thermo-electric heat pumps,
   a model based controller individually attached to each thermo-electric heat pump in said plurality of thermo-electric heat pumps, and
   a radiator coupled to said fluid loop for dissipating heat.

4. An augmented thermal bus as claimed in claim 3 wherein each of said thermo-electric heat pumps is coupled to each of said plurality of quadrants thereby individually controlling temperature in each of said plurality of quadrants.

5. An augmented thermal bus as claimed in claim 4 wherein said power supply applies a direct current of less than about 5 percent ripple, a voltage of less than about 0.5 volts and a current of about 10 amperes.

* * * * *